(12) United States Patent
Dufresne et al.

(10) Patent No.: US 9,992,903 B1
(45) Date of Patent: Jun. 5, 2018

(54) MODULAR RACK-MOUNTABLE IT DEVICE

(71) Applicant: EMC CORPORATION, Hopkinton, MA (US)

(72) Inventors: Daniel Dufresne, Salem, NH (US); Frank Miyahira, San Mateo, CA (US); Keith C. Johnson, Medway, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 78 days.

(21) Appl. No.: 14/871,467

(22) Filed: Sep. 30, 2015

(51) Int. Cl.
*H05K 7/14* (2006.01)
*H05K 7/18* (2006.01)

(52) U.S. Cl.
CPC ......... *H05K 7/1489* (2013.01); *H05K 7/1487* (2013.01); *H05K 7/1488* (2013.01); *H05K 7/1491* (2013.01); *H05K 7/1492* (2013.01); *H05K 7/183* (2013.01)

(58) Field of Classification Search
None
See application file for complete search history.

(56) References Cited

U.S. PATENT DOCUMENTS

| | | | | |
|---|---|---|---|---|
| 7,684,961 B1 * | 3/2010 | Robillard | ............ | G06F 11/326 702/183 |
| 8,126,904 B1 * | 2/2012 | Bettinger | ............ | G06Q 10/06 707/609 |
| 9,070,419 B1 * | 6/2015 | Zhu | .............. | H05K 7/1491 |
| 9,231,357 B1 * | 1/2016 | Felton | .............. | H01R 31/06 |
| 9,271,425 B1 * | 2/2016 | Lin | .............. | H05K 7/20736 |
| 9,335,786 B2 * | 5/2016 | Stewart | .............. | G06F 1/16 |
| 9,357,666 B1 * | 5/2016 | Felton | .............. | H05K 7/1487 |
| 2002/0154646 A1 * | 10/2002 | Dubois | .............. | H04Q 3/0029 370/406 |
| 2007/0070612 A1 * | 3/2007 | Coutancier | ......... | H05K 7/1489 361/797 |
| 2011/0228473 A1 * | 9/2011 | Anderson | ............ | G02B 6/4452 361/679.58 |
| 2012/0050986 A1 * | 3/2012 | Riebel | .................. | H05K 7/1488 361/679.48 |
| 2012/0281373 A1 * | 11/2012 | Bohannon | ............ | H05K 7/1489 361/756 |
| 2013/0163218 A1 * | 6/2013 | Kostecka | ............... | H05K 7/005 361/807 |
| 2014/0016265 A1 * | 1/2014 | Saito | .................. | G06F 1/16 361/679.48 |
| 2014/0281614 A1 * | 9/2014 | Mick | .................. | G05D 23/1917 713/322 |
| 2015/0029654 A1 * | 1/2015 | Li | .................. | H05K 7/1489 361/679.32 |
| 2015/0138717 A1 * | 5/2015 | Herman | ................ | G06F 1/181 361/679.32 |
| 2015/0280827 A1 * | 10/2015 | Adiletta | .................. | H01P 3/10 398/116 |

(Continued)

*Primary Examiner* — Binh Tran
*Assistant Examiner* — Douglas Burtner
(74) *Attorney, Agent, or Firm* — Brian J. Colandreo; Mark H. Whittenberger; Holland & Knight LLP

(57) ABSTRACT

A 1U rack-mountable computing device includes a storage component configured to include one or more storage devices. A second component is configured to be releasably coupleable to the storage component. A coupling system is configured to releasably couple the storage component to the second component.

20 Claims, 6 Drawing Sheets

(56) References Cited

U.S. PATENT DOCUMENTS

| | | | |
|---|---|---|---|
| 2015/0288410 A1* | 10/2015 | Adiletta | H04B 1/40 455/73 |
| 2015/0289405 A1* | 10/2015 | Stewart | H05K 7/183 211/26 |
| 2015/0309952 A1* | 10/2015 | Breakstone | G06F 13/4022 710/313 |
| 2015/0373115 A1* | 12/2015 | Breakstone | G06F 11/2012 709/217 |
| 2016/0073544 A1* | 3/2016 | Heyd | G11B 33/128 361/679.31 |
| 2016/0205804 A1* | 7/2016 | Hartman | H05K 7/20836 361/679.31 |
| 2017/0150621 A1* | 5/2017 | Breakstone | G06F 13/4022 |
| 2017/0235347 A1* | 8/2017 | Heyd | G06F 1/185 361/679.31 |

* cited by examiner

FIG. 2A (front view)

MODULAR RACK-MOUNTABLE IT DEVICE

TECHNICAL FIELD

This disclosure relates to IT devices and, more particularly, to rack-mountable IT devices.

BACKGROUND

In today's IT infrastructure, high availability is of paramount importance. Specifically, critical (and sometimes non-critical) components within an IT infrastructure are often layered in redundancy. For example, primary servers may be supported by backup servers; primary switches may be supported by backup switches; primary power supplies may be supported by backup power supplies; and primary storage systems may be supported by backup storage systems.

Oftentimes, various IT devices are mounted within IT racks and need to be serviced in the field. Naturally, the quicker these IT devices can be serviced, the less downtime for the IT device. Typically, rack-mounted IT devices are mounted on rail assemblies that allow the IT devices to slide into and out of the IT racks. Unfortunately, the removal of these IT devices from these IT racks requires that the various IO connections coupling the IT device to the network infrastructure be disconnected, which may be a considerable and complex task.

SUMMARY OF DISCLOSURE

In one implementation, a 1U rack-mountable computing device includes a storage component configured to include one or more storage devices. A second component is configured to be releasably coupleable to the storage component. A coupling system is configured to releasably couple the storage component to the second component.

One or more of the following features may be included. The one or more storage devices may include at least one hard disk drive. The one or more storage devices may include at least one solid state storage device. The coupling system may include one or more screw assemblies. The coupling system may include one or more latching assemblies. The second component may include an input/output component configured to couple the 1U rack-mountable computing device to a network infrastructure. The network infrastructure may include one or more of: an Ethernet infrastructure; a fiber channel infrastructure; and an infiniband infrastructure. The second component may further include a processing component configured to include one or more microprocessors. The processing component may be further configured to be releasably coupleable to the input/output component and the storage component. The coupling system may be further configured to releasably couple the processing component and the input/output component. The coupling system may include one or more screw assemblies. The coupling system may include one or more latching assemblies.

In another implementation, a 1U rack-mountable computing device includes a storage component configured to include one or more storage devices. A processing component is configured to include one or more microprocessors and be releasably coupleable to the storage component. An input/output component is configured to couple the 1U rack-mountable computing device to a network infrastructure and be releasably coupleable to the processing component. A coupling system is configured to releasably couple the storage component, the processing component, and the input/output component.

One or more of the following features may be included. The one or more storage devices may include at least one hard disk drive. The one or more storage devices may include at least one solid state storage device. The coupling system may include one or more screw assemblies. The coupling system may include one or more latching assemblies. The network infrastructure may include one or more of: an Ethernet infrastructure; a fiber channel infrastructure; and an infiniband infrastructure.

In another implementation, a 1U rack-mountable computing device includes a storage component configured to include one or more storage devices. A processing component is configured to include one or more microprocessors and be releasably coupleable to the storage component. An input/output component is configured to couple the 1U rack-mountable computing device to a network infrastructure and be releasably coupleable to the processing component. A coupling system is configured to releasably couple the storage component, the processing component, and the input/output component. The network infrastructure includes one or more of: an Ethernet infrastructure, a fiber channel infrastructure, and an infiniband infrastructure. The one or more storage devices includes one or more of: at least one hard disk drive, and at least one solid state storage device.

One or more of the following features may be included. The coupling system may include one or more of: one or more screw assemblies; and one or more latching assemblies.

The details of one or more implementations are set forth in the accompanying drawings and the description below. Other features and advantages will become apparent from the description, the drawings, and the claims.

BRIEF DESCRIPTION OF THE DRAWINGS

FIG. 2A is a front view of the modular 1U rack-mountable computing device of FIG. 2;

Like reference symbols in the various drawings indicate like elements.

DETAILED DESCRIPTION OF THE PREFERRED EMBODIMENTS

Figure 1:
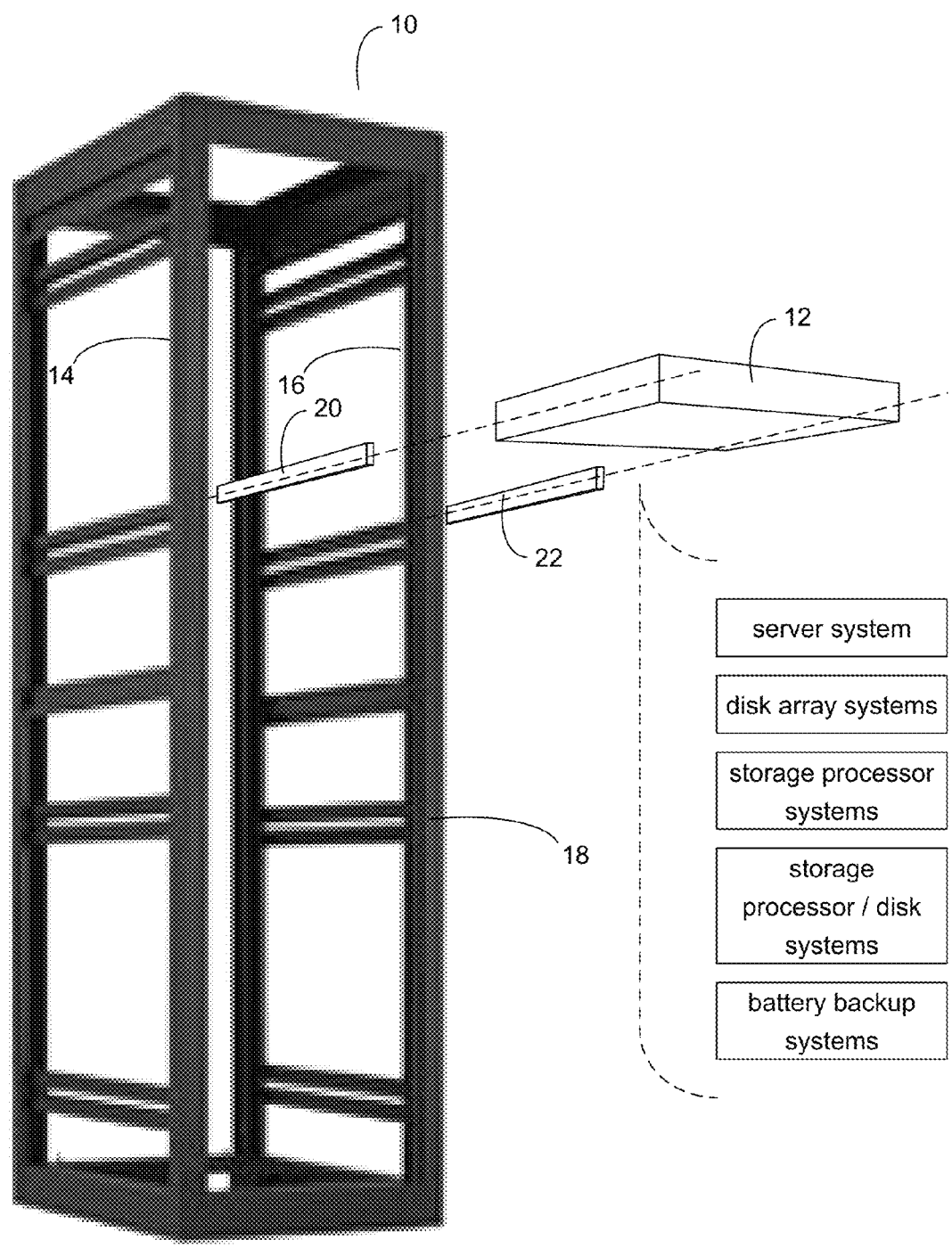
FIG. 1 is a perspective view of an IT rack and an IT device.

Referring to FIG. 1, IT racks (e.g., IT rack 10) may be utilized to store and organize IT devices. For example, IT rack 10 may be placed within a computer room and various IT devices (e.g., IT device 12) may be attached to rails (e.g., NEMA rails 14, 16) included within IT rack 10, wherein these rails (e.g., NEMA rails 14, 16) may have a standard and defined spacing between them (e.g., 19"). Typically, IT devices that are configured to fit within IT rack 10 may be described as rack-mountable IT devices.

Examples of the various IT devices (e.g., IT device 12) mountable within IT rack 10 may include but are not limited to: server systems, disk array systems, storage processor systems, storage processor/disk systems, and battery backup systems.

IT rack 10 may include frame 18 (which may include one or more vertical supports, horizontal supports, and cross braces) to which NEMA rails 14, 16 may be attached. NEMA rails 14, 16 may include a plurality of evenly spaced holes that may be configured for mounting the various IT devices within IT rack 10. By standardizing the spacing between NEMA rails 14, 16, the various IT devices that fit within a first IT rack may also fit within a second IT rack.

Typically, IT racks are defined in accordance with the number of rack units (U's) included within the rack. For example, a 1U IT device is half as high as a 2U IT device, which is half as high as a 4U IT device. Accordingly, while the number of rack units available within a particular IT rack may be rigidly defined by the size of the IT rack, the number of IT devices mountable within that IT rack may vary depending upon the size (in rack units) of the particular IT devices being mounted within that IT rack. Therefore, by reducing the number of rack units that a particular IT device uses within an IT rack, additional IT computing devices may be mounted within the IT rack.

Figure 1A:
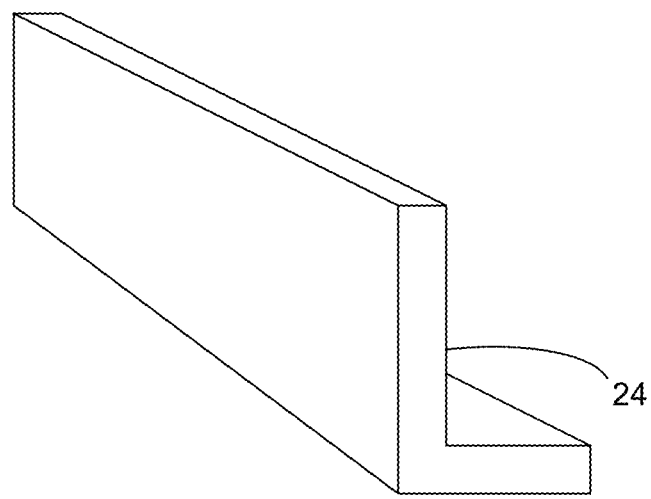
FIGS. 1A-1B are diagrammatic views of track assemblies usable within the IT rack of FIG. 1.
Figure 1B:
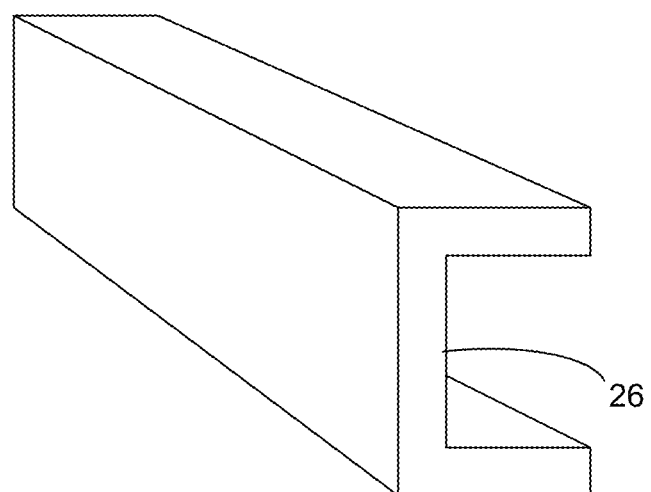

Oftentimes, positioned between NEMA rails 14, 16 and the IT device (e.g., IT device 12) are track assemblies (e.g., track assemblies 20, 22) that may allow IT device 12 to slide into and out of IT rack 10. Examples of track assemblies 20, 22 may include "L" track assembly 24 (e.g., a track assembly that has a general "L" shape, as shown in FIG. 1A) and "C" track assembly 26 (e.g., a track assembly that has a generally "C" shaped profile, as shown in FIG. 1B).

Figure 2:
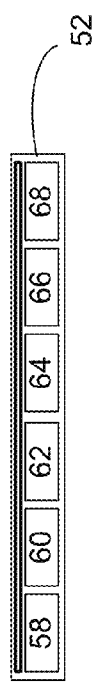
FIG. 2 is a diagrammatic view of a modular 1U rack-mountable computing device for use within the IT rack of FIG. 1.
Figure 2:
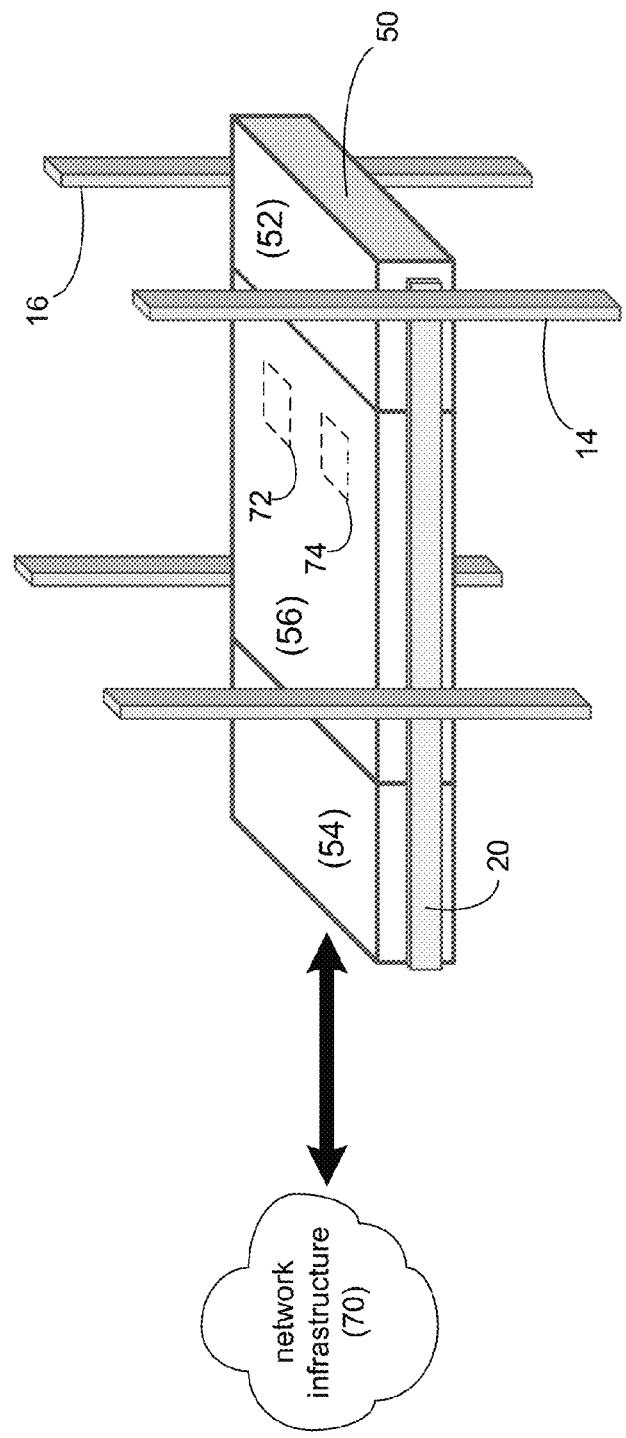

Referring to FIG. 2, there is shown one example of IT device 12, namely modular 1U rack-mountable computing device 50. In this particular embodiment, modular 1U rack-mountable computing device 50 is shown to include a plurality of individual components, examples of which may include but are not limited to storage component 52, input/output component 54, and processing component 56.

Storage component 52 may be the portion of modular 1U rack-mountable computing device 50 that is configured to store data. Examples of such data may include but are not limited to data that is generated remotely (e.g., by applications that are executed on remote devices) or data that is generated locally (e.g., by applications that are executed on modular 1U rack-mountable computing device 50). Accordingly, storage component 52 may be configured to include one or more storage devices, examples of which may include but are not limited to one or more rotating-media hard disk drives (e.g., SATA drives or SCSI drives) and/or one or more solid state storage devices (e.g., flash drives). For example and as shown in FIG. 2A, storage component 52 may be configured to include six 2.5 inch form factor storage devices (e.g., storage devices 58, 60, 62, 64, 66, 68).

Input/output component 54 may be the portion of modular 1U rack-mountable computing device 50 that is configured to couple modular 1U rack-mountable computing device 50 to a network infrastructure (e.g., network infrastructure 70), wherein network infrastructure 70 may be configured to couple modular 1U rack-mountable computing device 50 to other modular 1U rack-mountable computing devices, other IT devices (e.g., server systems, disk array systems, storage processor systems, storage processor/disk systems, and battery backup systems), other networking devices (e.g., switches, routers, bridges, wireless access points), and/or end user computing devices (e.g., desktop computers, laptop computers, notebook computers, smartphones, tablet computers, etc.). Examples of network infrastructure 70 may include but are not limited to an Ethernet infrastructure; a fiber channel infrastructure; and an infiniband infrastructure.

Processing component 56 may be the portion of modular 1U rack-mountable computing device 50 that is configured to process data, such as data that is generated remotely (e.g., by applications that are executed on remote devices) or data that is generated locally (e.g., by applications that are executed on modular 1U rack-mountable computing device 50). Accordingly, processing component 56 may be configured to include one or more microprocessors (e.g., microprocessors 72, 74).

Through the use of modular 1U rack-mountable computing device 50, modular 1U rack-mountable computing device 50 may be more easily serviced in the field by service technicians. Specifically, processing component 56 may be configured to be releasably coupleable to input/output component 54 and/or storage component 52.

Figure 3:
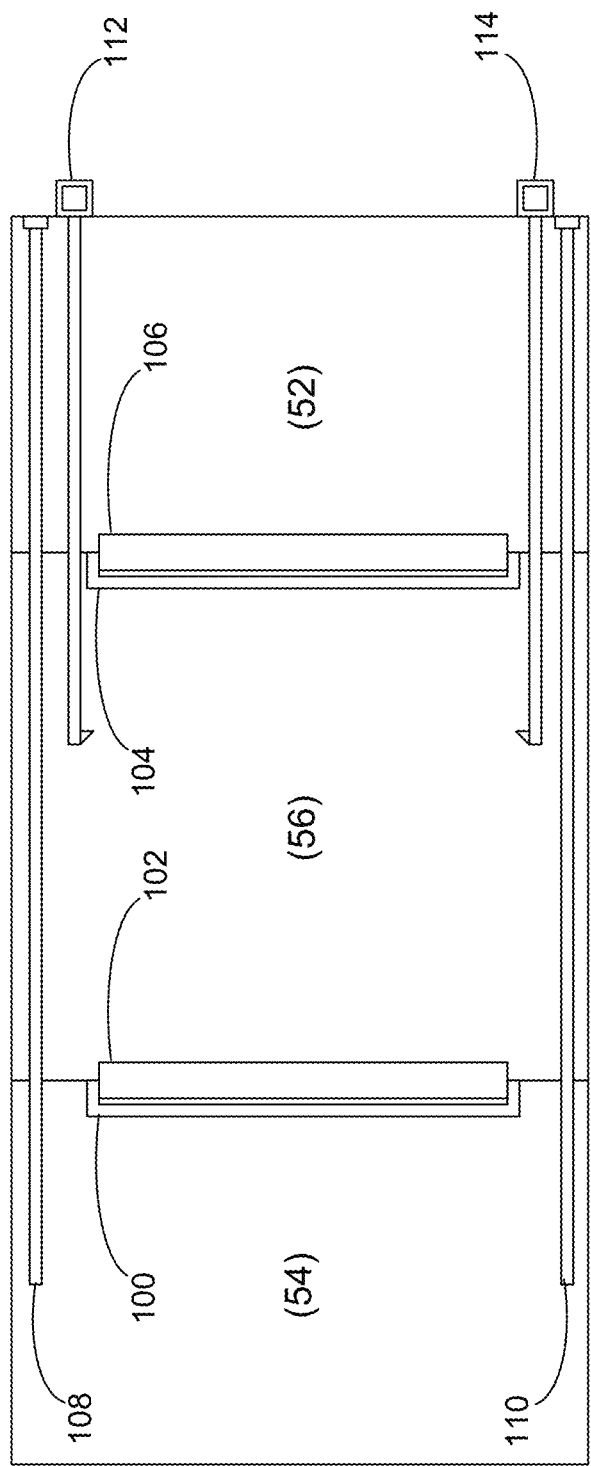
FIG. 3 is a diagrammatic view of the modular 1U rack-mountable computing device of FIG. 2 including a coupling system.

For example and referring also to FIG. 3, each of processing component 56, input/output component 54, and storage component 52 may contain one or more electrical connector assemblies and alignment assemblies (e.g., alignment pins) to enable e.g., input/output component 54 to releasably couple (both electrically and mechanically) processing component 56, and to enable processing component 56 to releasably couple (both electrically and mechanically) storage component 52.

Specifically and in the following illustrative example, input/output component 54 may include female electrical connector assembly 100 that is configured to releasably couple male electrical connector assembly 102 included within processing component 56. Electrical connector assemblies 100, 102 may be configured and sized to accommodate the required number of electrical signals passing between input/output component 54 and processing component 56. Further, processing component 56 may include female electrical connector assembly 104 that is configured to releasably couple male electrical connector assembly 106 included within storage component 52. Electrical connector assemblies 104, 106 may be configured and sized to accommodate the required number of electrical signals passing between processing component 56 and storage component 52.

Modular 1U rack-mountable computing device 50 may include a coupling system configured to releasably couple two or more of processing component 56, input/output component 54, and storage component 52 together. Examples of such a coupling system may include but are not limited to one or more screw assemblies (e.g., screw assemblies 108, 110) or one or more latching assemblies (e.g., latching assemblies 112, 114). Specifically, screw assemblies 108, 110 may be configured to releasably couple processing component 56 and input/output component 54 together, processing component 56 and storage component 52 together, or processing component 56, input/output component 54 together and storage component 52 together. Additionally/alternatively, latch assemblies 112, 114 may be configured to releasably couple processing component 56 and input/output component 54 together, processing component 56 and storage component 52 together, or processing component 56, input/output component 54 together and storage component 52 together.

As stated above, through the use of modular 1U rack-mountable computing device 50, modular 1U rack-mountable computing device 50 may be more easily serviced in the field by service technicians.

Figure 4:
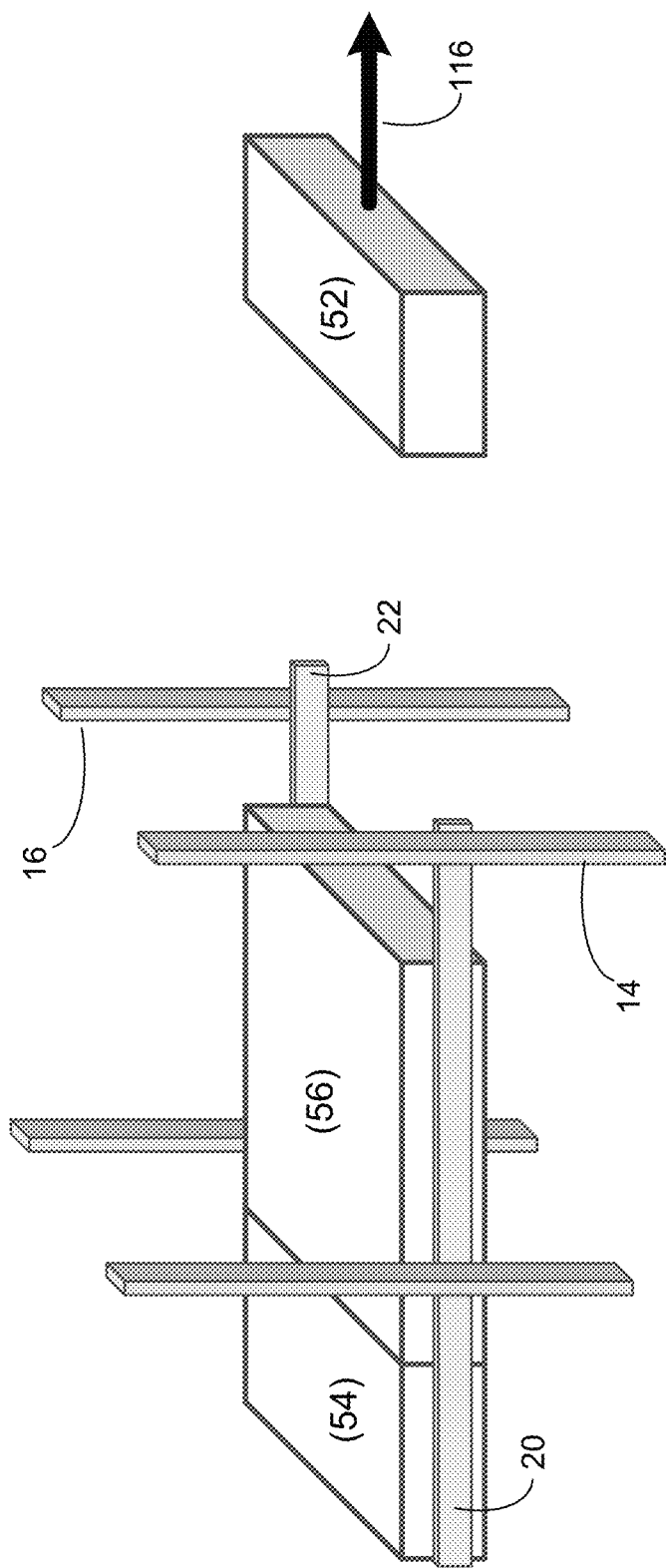
FIG. 4 is another diagrammatic view of the modular 1U rack-mountable computing device of FIG. 2.

Specifically and referring also to FIG. 4, in the event that storage component 52 has failed but input/output component 54 and processing component 56 are functioning properly, the service technician may remove e.g., screw assemblies 108, 110 and/or latch assemblies 112, 114, thus allowing storage component 52 to be uncoupled from (in this example) processing component 56 and removed in the direction of arrow 116. Further, processing component 56 and input/output component 54 may remain within IT rack 10 and, therefore, input/output component 54 may not need to be disconnected from network infrastructure 70.

Figure 5:
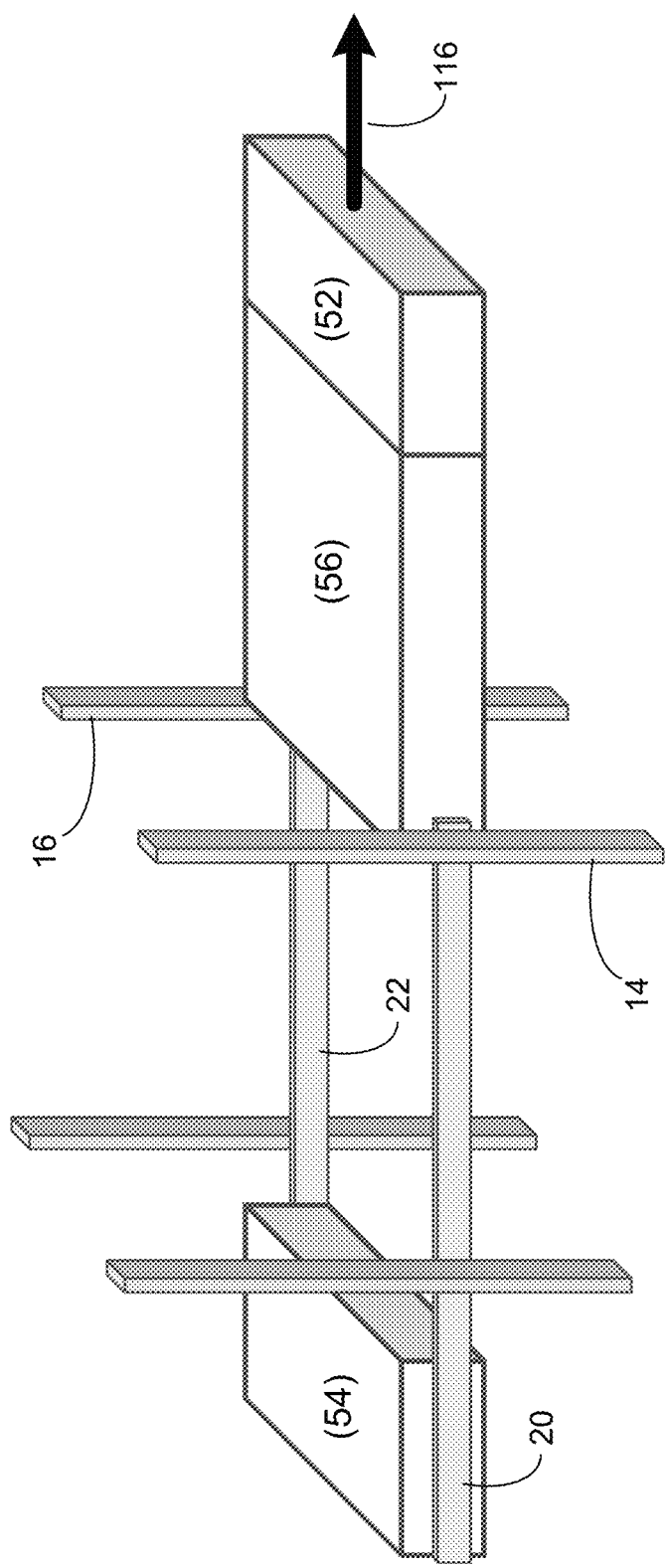
FIG. 5 is another diagrammatic view of the modular 1U rack-mountable computing device of FIG. 2.

Further and referring also to FIG. 5, in the event that storage component 52 and processing component 56 have failed but input/output component 54 is functioning properly, the service technician may remove e.g., screw assemblies 108, 110 and/or latch assemblies 112, 114, thus allowing storage component 52 and processing component 56 to be uncoupled from (in this example) input/output component 54 and removed in the direction of arrow 116. Further, input/output component 54 may remain within IT rack 10 and, therefore, input/output component 54 may not need to be disconnected from network infrastructure 70.

While the above-stated example concerns components being removed from the front of IT rack 10, this is for illustrative purposes only and is not intended to be a limitation of this invention, as other configurations are possible. For example, components (e.g., input/output component 54 and processing component 56) may be removed from the back of IT rack 10.

General:

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

A number of implementations have been described. Having thus described the disclosure of the present application in detail and by reference to embodiments thereof, it will be apparent that modifications and variations are possible without departing from the scope of the disclosure defined in the appended claims.

What is claimed is:

1. A 1U rack-mountable computing device comprising:
   a storage component configured to include one or more storage devices, wherein the storage component includes a first electrical connector assembly;
   a second component configured to be releasably coupleable to the storage component, wherein the second component includes a second electrical connector assembly configured to releasably couple directly to the first electrical connector assembly of the storage component; and
   a coupling system configured to releasably couple the storage component to the second component.

2. The 1U rack-mountable computing device of claim 1 wherein the one or more storage devices includes at least one hard disk drive.

3. The 1U rack-mountable computing device of claim 1 wherein the one or more storage devices includes at least one solid state storage device.

4. The 1U rack-mountable computing device of claim 1 wherein the coupling system includes one or more screw assemblies.

5. The 1U rack-mountable computing device of claim 1 wherein the coupling system includes one or more latching assemblies.

6. The 1U rack-mountable computing device of claim 1 wherein the second component includes an input/output component configured to couple the 1U rack-mountable computing device to a network infrastructure.

7. The 1U rack-mountable computing device of claim 6 wherein the network infrastructure includes one or more of:
   an Ethernet infrastructure;
   a fiber channel infrastructure; and
   an infiniband infrastructure.

8. The 1U rack-mountable computing device of claim 6 wherein the second component further includes a processing component configured to include one or more microprocessors.

9. The 1U rack-mountable computing device of claim 8 wherein the processing component is further configured to be releasably coupleable to the input/output component and the storage component.

10. The 1U rack-mountable computing device of claim 9 wherein the coupling system is further configured to releasably couple the processing component and the input/output component.

11. The 1U rack-mountable computing device of claim 10 wherein the coupling system includes one or more screw assemblies.

12. The 1U rack-mountable computing device of claim 10 wherein the coupling system includes one or more latching assemblies.

13. A 1U rack-mountable computing device comprising:
   a storage component configured to include one or more storage devices, wherein the storage component includes a first electrical connector assembly;
   a processing component configured to include one or more microprocessors and be releasably coupleable to the storage component, wherein the processing component includes a second electrical connector assembly configured to releasably couple directly to the first electrical connector assembly of the storage component;
   an input/output component configured to couple the 1U rack-mountable computing device to a network infrastructure and be releasably coupleable to the processing component; and a coupling system configured to releasably couple the storage component, the processing component, and the input/output component.

14. The 1U rack-mountable computing device of claim 13 wherein the one or more storage devices includes at least one hard disk drive.

15. The 1U rack-mountable computing device of claim 13 wherein the one or more storage devices includes at least one solid state storage device.

16. The 1U rack-mountable computing device of claim 13 wherein the coupling system includes one or more screw assemblies.

17. The 1U rack-mountable computing device of claim 13 wherein the coupling system includes one or more latching assemblies.

18. The 1U rack-mountable computing device of claim 13 wherein the network infrastructure includes one or more of:
   an Ethernet infrastructure;
   a fiber channel infrastructure; and
   an infiniband infrastructure.

19. A 1U rack-mountable computing device comprising:
   a storage component configured to include one or more storage devices, wherein the storage component includes a first electrical connector assembly;
   a processing component configured to include one or more microprocessors and be releasably coupleable to the storage component, wherein the processing component includes a second electrical connector assembly configured to releasably couple directly to the first electrical connector assembly of the storage component;
   an input/output component configured to couple the 1U rack-mountable computing device to a network infrastructure and be releasably coupleable to the processing component; and
   a coupling system configured to releasably couple the storage component, the processing component, and the input/output component;
   wherein the network infrastructure includes one or more of: an Ethernet infrastructure, a fiber channel infrastructure, and an infiniband infrastructure; and
   wherein the one or more storage devices includes one or more of: at least one hard disk drive, and at least one solid state storage device.

20. The 1U rack-mountable computing device of claim 19 wherein the coupling system includes one or more of:
   one or more screw assemblies; and
   one or more latching assemblies.

* * * * *